(12) United States Patent
Gui

(10) Patent No.: US 11,119,418 B2
(45) Date of Patent: Sep. 14, 2021

(54) FOCUS COMPENSATION METHOD AND APPARATUS THEREOF

(71) Applicant: WUHAN CHINA STAR OPTOELECTRONICS TECHNOLOGY CO., LTD, Hubei (CN)

(72) Inventor: Yuchang Gui, Hubei (CN)

(73) Assignee: Wuhan China Star Optoelectronics Technology Co., Ltd., Hubei (CN)

( * ) Notice: Subject to any disclaimer, the term of this patent is extended or adjusted under 35 U.S.C. 154(b) by 78 days.

(21) Appl. No.: 16/613,422

(22) PCT Filed: Jun. 14, 2019

(86) PCT No.: PCT/CN2019/091252
§ 371 (c)(1),
(2) Date: Nov. 14, 2019

(87) PCT Pub. No.: WO2020/062941
PCT Pub. Date: Apr. 2, 2020

(65) Prior Publication Data
US 2020/0218168 A1     Jul. 9, 2020

(30) Foreign Application Priority Data

Sep. 27, 2018  (CN) .......................... 201811129778.7

(51) Int. Cl.
*G03F 7/20* (2006.01)

(52) U.S. Cl.
CPC ............................. *G03F 7/70641* (2013.01)

(58) Field of Classification Search
CPC .. G01N 21/22; G01N 21/9501; G01N 21/956; G03F 7/70641
USPC ....................................................... 355/67–71
See application file for complete search history.

(56) References Cited

U.S. PATENT DOCUMENTS

| | | | | |
|---|---|---|---|---|
| 6,208,748 B1* | 3/2001 | Troccolo | ............. | G03F 7/70641 382/100 |
| 7,092,082 B1* | 8/2006 | Dardzinski | ........ | G01N 21/9501 250/201.3 |
| 2002/0033945 A1* | 3/2002 | Xu | ........................ | G01N 21/211 356/369 |
| 2002/0067477 A1* | 6/2002 | Morita | ................. | G01N 21/956 356/237.5 |

\* cited by examiner

*Primary Examiner* — Hung Nguyen
(74) *Attorney, Agent, or Firm* — Mark M. Friedman

(57) ABSTRACT

A focus compensation method and apparatus thereof are provided. The focusing compensation method includes steps of: (S11) providing an exposure lens set; (S12) providing an object, measuring line-widths of the object at points of line segments along an axial direction by different focusing conditions, to obtain measured values, and obtaining at least one line-width curve from the measured values; and (S13) calibrating a focusing operation of the exposure lens set according to the at least one line-width curve. Line-widths of a product are measured, and fed back to an exposure machine to calibrate the focusing operations of the exposure machine, thereby improving the focusing accuracy of the exposure machine.

13 Claims, 3 Drawing Sheets providing an exposure lens set having a focus — S11 providing objects, measuring a plurality of line-widths of each of the objects at a plurality of points of line segments along an axial direction by a plurality of different focusing conditions, to obtain a plurality of measured values, and obtaining at least one line-width curve from the plurality of measured values — S12 calibrating a focusing operation of the exposure lens set according to the at least one line-width curve — S13

FOCUS COMPENSATION METHOD AND APPARATUS THEREOF

FIELD OF INVENTION

The invention relates to a focusing compensation method and a device thereof, in particular to a focusing compensation method and apparatus thereof for an exposure machine.

BACKGROUND OF INVENTION

In recent years, due to a requirement for high integration and miniaturization of semiconductor integrated circuits, accuracy requirements for focusing are more strict.

Taking liquid crystal display industry as an example, a liquid crystal screen resolution is higher and higher, focusing accuracy for a product using on an exposure machine has higher requirements.

In general, current technology mainly improves focusing stability by measuring a plurality of points by an exposure machine.

Technical Problem

However, low-temperature polysilicon process of a display manufacturing process in use of actual exposure machine focusing still has the following problems.

For example, due to a complicated stacking layers structure in the low-temperature polysilicon process, and parameters such as self-flatness and deflection of a mask will have a great influence on the focusing accuracy of the exposure machine.

Therefore, it is necessary to provide a focusing compensation method to solve the problems existing in the conventional art.

SUMMARY OF INVENTION

In view of above, the present invention provides a focusing compensation method to solve the problem of insufficient focusing accuracy of an exposure machine existing in the conventional art.

A primary object of the present invention to provide a focusing compensation method that can improve exposure accuracy of an exposure machine.

A secondary object of the present invention is to provide a focusing compensation method, which can consider self-flatness and deflection of the object, and then calibrate the focus of the exposure machine to improve the accuracy of the focusing of the exposure machine.

In order to achieve the aforementioned objects of the present invention, an embodiment of the present invention provides a focusing compensation method, including steps of:

(S11) providing an exposure lens set for a photolithography process, the exposure lens set having a focus;

(S12) providing an object, measuring a plurality of line-widths of the object at a plurality of points of line segments along an axial direction by a plurality of different focusing conditions, to obtain a plurality of measured values, and obtaining at least one line-width curve from the plurality of measured values; and (S13) obtaining a compensation value from the at least one line-width curve, and utilizing the compensation value to calibrate a focusing operation performed by the exposure lens set at the plurality of points of line segments along a plurality of the axial directions.

In an embodiment of the present invention, the plurality of different focusing conditions are to dispose the object on a plurality of different focal planes, and measure the line-width of the object.

In an embodiment of the present invention, the plurality of different focusing conditions are disposing the object under five focal planes, and the five focal planes are located at −40 microns from the focus, −20 microns from the focus, the focus, +20 microns from the focus, and +40 microns from the focus.

In an embodiment of the present invention, the step (S12) further includes:

subtracting a second line-width at a lowest point of the line-width curve from a first line-width measured at the focus, to obtain the compensation value; and utilizing the compensation value to calibrate the focusing operation performed by the exposure lens set.

In an embodiment of the present invention, the step (S13) further includes:

measuring the plurality of line-widths of the object at the plurality of points of the line segments along the plurality of axial directions, to obtain a plurality of the line-width curves; and obtaining a plurality of the compensation values from the plurality of line-width curves, and utilizing the plurality of compensation values to calibrate the focusing operation performed by the exposure lens set at the plurality of points of line segments along a plurality of axial directions.

Another embodiment of the present invention provides a focusing compensation method, the focusing compensation method includes: (S11) providing an exposure lens set having a focus; (S12) providing an object, measuring a plurality of line-widths of the object at a plurality of points of line segments along an axial direction by a plurality of different focusing conditions, to obtain a plurality of measured values, and obtaining at least one line-width curve from the plurality of measured values; and (S13) calibrating a focusing operation of the exposure lens set according to the at least one line-width curve.

In an embodiment of the present invention, the plurality of different focusing conditions are to dispose the object on a plurality of different focal planes, and measure the line-width of the object.

In an embodiment of the present invention, the plurality of different focusing conditions are disposing the object under five focal planes, and the five focal planes are located at −40 microns from the focus, −20 microns from the focus, the focus, +20 microns from the focus, and +40 microns from the focus.

In an embodiment of the present invention, the step (S12) further includes: subtracting a second line-width at a lowest point of the line-width curve from a first line-width measured at the focus, to obtain a compensation value; and calibrating the focusing operation of the exposure lens set according to the compensation value.

In an embodiment of the present invention, the step (S12) further includes: measuring the plurality of line-widths of the object at the plurality of points of the line segments along the plurality of axial directions, to obtain a plurality of the line-width curves; and obtaining a plurality of the compensation values from the plurality of line-width curves, and utilizing the plurality of compensation values to calibrate the focusing operation performed by the exposure lens set at the plurality of points of line segments along a plurality of axial directions.

Moreover, an embodiment of the present invention provides a focusing compensation apparatus, wherein the focusing compensation apparatus including: an exposure lens set having a focus; an object platform, configured to dispose an object, wherein the exposure lens set is configured to measure a plurality of line-widths of the object at a plurality of points of line segments along an axial direction by a plurality of different focusing conditions, to obtain a plurality of measured values; a processing module configured to obtain at least one line-width curve from the plurality of measured values, and obtain a compensation signal according to the at least one line-width curve; and a communication module configured to transmit the compensation signal to the exposure lens set, so as to calibrate a focusing operation of the exposure lens set.

In an embodiment of the present invention, the object platform includes a height adjustment member configured to set the object platform at one of different heights, so as to dispose the object on one of a plurality of different focal planes, to measure the line-width of the object.

In an embodiment of the present invention, the height adjustment member has five different heights corresponding to five focal planes of the exposure lens set, the five focal planes are respectively located at −40 microns from the focus, −20 microns from the focus, the focus, +20 microns from the focus, and +40 microns from the focus.

In an embodiment of the present invention, the processing module configured to subtract a second line-width at a lowest point of the line-width curve from a first line-width measured at the focus, to obtain a compensation value, and convert the compensation value into the compensation signal.

In an embodiment of the present invention, the exposure lens set further includes a plurality of lens groups configured to measure the plurality of line-widths of the object at the plurality of points of the line segments along a plurality of axial directions at a same time, to obtain a plurality of the line-width curves; and the processing module is configured to obtain a plurality of the compensation values from the plurality of line-width curve, and utilizing the plurality of compensation values to calibrate the focusing operation performed by the exposure lens set at the plurality of points of line segments along a plurality of axial directions.

Beneficial Effect

Compared with the conventional art, the focusing compensation method of the present invention, it will not only improve the exposure accuracy of the exposure machine, but also allow the exposure machine to focus on the self-flatness and deflection of the object, thereby calibrating the focus of the exposure machine to achieve improving the focusing accuracy of the exposure machine.

DRAWINGS

In order to make the above-mentioned contents of the present invention more comprehensible, the preferred embodiments are described below, and in conjunction with the accompanying drawings, the detailed description is as follows.

DETAILED DESCRIPTION OF EMBODIMENTS

The following description of the various embodiments is provided to illustrate the specific embodiments of the invention. Furthermore, the directional terms mentioned in the present invention, such as upper, lower, top, bottom, front, rear, left, right, inner, outer, side, surrounding, central, horizontal, lateral, vertical, longitudinal, axial, radial, uppermost or lowermost, etc., only refer to the direction of the additional schema. Therefore, the directional terminology used is for the purpose of illustration and understanding of the invention.

The terms "comprising", "having" and their conjugations as used herein refer to "including but not limited to".

The terms "a", "an" and "at least one" as used herein may include the plural reference unless the context clearly dictates otherwise. For example, the terms "a processing module" or "at least one processing module" can encompass a plurality of processing modules, including compositions thereof.

The terms "a plurality of" and "several" as used herein may be selected from two, three, or more unless otherwise indicated, and "at least one" may be selected from one, two, three, or more unless otherwise indicated.

The sizes and values disclosed herein are not intended to be construed as being strictly limited to the precise values. Conversely, unless otherwise indicated, the various sizes are intended to represent the recited numerical values as well as the functionally equivalent ranges thereof. For example, the disclosed size of "10 microns" means "about 10 microns".

The term "optionally" as used herein may refer to be provided in some embodiments, but not provided in other embodiments. Any particular embodiment of the invention may contain a plurality of "optional" features unless such features conflict.

Figure 1:
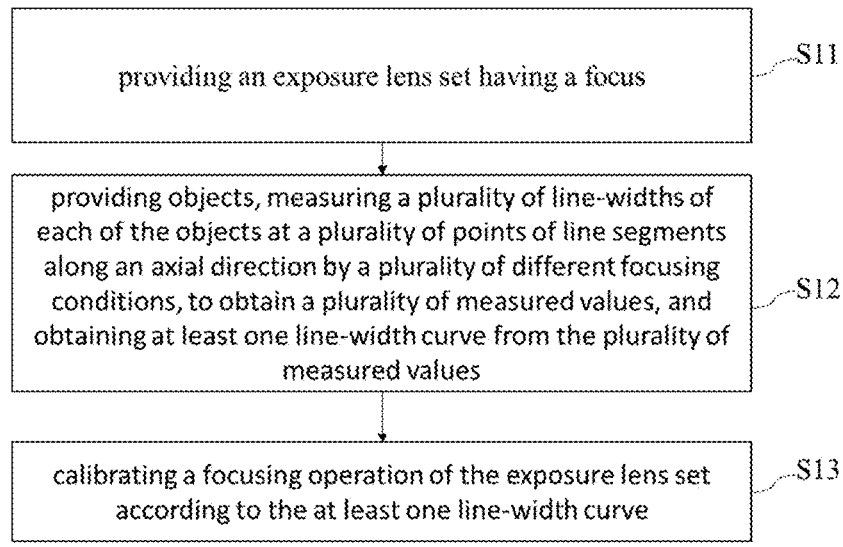
FIG. 1 is a schematic flow chart of a focusing compensation method according to an embodiment of the present invention.

Referring to FIG. 1, a focusing compensation method according to an embodiment of the present invention mainly includes following steps: (S11) providing an exposure lens set having a focus; (S12) providing an object, measuring line-widths of the object at points of line segments along an axial direction by different focusing conditions, to obtain measured values, and obtaining at least one line-width curve from the measured values; and (S13) calibrating a focusing operation of the exposure lens set according to the at least one line-width curve.

The present invention will hereinafter be described the detailed construction, assembly relationship, and operation principle of the above-described respective elements of the embodiments of FIG. 1 to FIG. 2 in detail.

Figure 2:
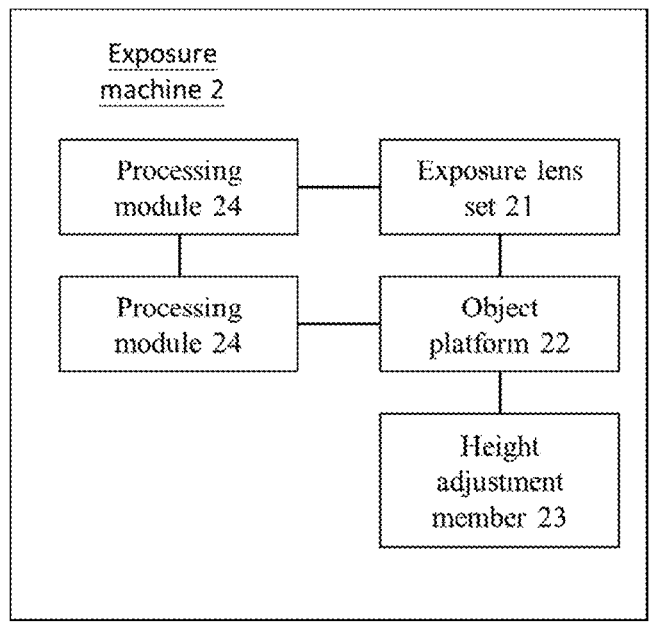
FIG. 2 is a block diagram of a focusing compensation apparatus according to an embodiment of the present invention.
Figure 3:
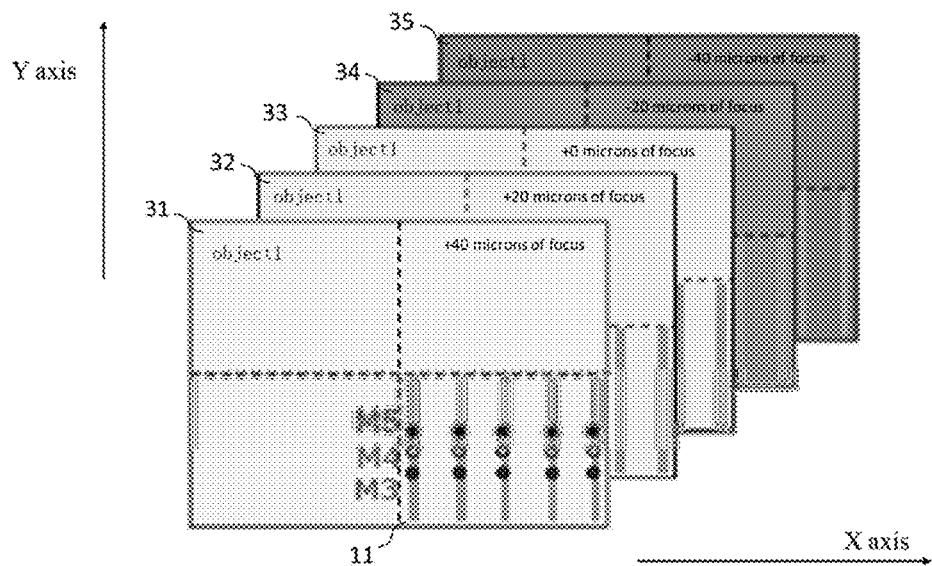
FIG. 3 is a schematic view of an object of a focusing compensation method according to an embodiment of the present invention.

Referring to FIG. 1, FIG. 2, and FIG. 3, illustrate an exposure lens set 21 in a focusing compensation method and an apparatus thereof according to an embodiment of the present invention. For example, the exposure lens set 21 is used in an exposure machine 2 during a photolithography process, the exposure lens set 21 having a focus; the exposure machine 2 further includes an object platform 22 configured to dispose an object 1, the exposure lens set 21 configured to measure line-widths of the object 1 at points of line segments along an axial direction by different focusing conditions, to obtain measured values; a processing module 24 configured to obtain at least one line-width curve from the measured values, and obtain a compensation signal according to the at least one line-width curve; and a communication module 25 configured to transmit the compensation signal to the exposure lens set 21, so as to calibrate a focusing operation of the exposure lens set 21. The object platform 22 includes a height adjustment member 23 configured to set the object platform 22 at one of different heights. According to an exemplary embodiment of the present invention, the different focusing conditions are to dispose the object under five focal planes (31, 32, 33, 34, and 35), the five focal planes are: a first focal plane 31 is located at −40 microns from the focus, a second focal plane 32 is located at −20 microns from the focus, a third focal plane 33 is located at the focus, a fourth focal plane 34 is located at +20 microns from the focus, and a fifth focal plane 35 is located at +40 microns from the focus. The height adjustment member 23 has five different heights corresponding to the five focal planes of the exposure lens set 21.

Please refer to FIG. 3, the exposure lens set 21 configured to measure line-widths of the object 1 at points of line segments along an axial direction by different focusing conditions, for example, the object 1 is disposed on different focal planes, and measuring line-widths of the line segments 11 which is located at a trace of the object 1. According to an exemplary embodiment of the present invention, when the height adjustment member 23 sets the object platform 22 to the first focal plane 31 (i.e., located at −40 microns of the focus), the line-widths of the line segments 11 of the object 1 are measured at M3 points along a direction of the X axis, so as to obtain a first measured value. Next, when the height adjustment member 23 sets the object platform 22 to the second focal plane 32 (i.e., located at −20 microns of the focus), the line-widths of the line segments 11 of the object 1 are measured at the same M3 points along a direction of the X axis, so as to obtain a second measured value. Then, when the height adjustment member 23 sets the object platform 22 to the third focal plane 33 (i.e., located at the focus), the line-widths of the line segments 11 of the object 1 are measured at the same M3 points along a direction of the X axis, so as to obtain a third measured value. Furthermore, when the height adjustment member 23 sets the object platform 22 to the forth focal plane 34 (i.e., located at +20 microns of the focus), the line-widths of the line segments 11 of the object 1 are measured at the same M3 points along a direction of the X axis, so as to obtain a fourth measured value. Finally, when the height adjustment member 23 sets the object platform 22 to the fifth focal plane 35 (i.e., located at +40 microns of the focus), the line-widths of the line segments 11 of the object 1 are measured at the same M3 points along a direction of the X axis, so as to obtain a fifth measured value. The measured values (e.g., the first measured value, the second measured value, the third measured value, the fourth measured value, and the fifth measured value) draw a line-width curve.

Referring also to FIG. 3, in another embodiment of the invention, it can also measure the line-widths of the object at the points of the line segments along the axial directions, so as to obtain the line-width curves. For example, when the height adjustment member 23 sets the object platform 22 to the first focal plane 31 (i.e., located at −40 microns of the focus), the line-widths of the line segments 11 of the object 1 are measured at M3 points along a direction of the X axis, then line-widths are measured by shifting a distance along Y axis at M4 point and line-widths are finally measured by shifting a distance along Y axis at M5 point, so as to obtain a first measured value. Next, when the height adjustment member 23 sets the object platform 22 to the second focal plane 32 (i.e., located at −20 microns of the focus), the line-widths of the line segments 11 of the object 1 are measured at M3 points along a direction of the X axis, then line-widths are measured by shifting a distance along Y axis at M4 point and line-widths are finally measured by shifting a distance along Y axis at M5 point, so as to obtain a second measured value. Then, when the height adjustment member 23 sets the object platform 22 to the third focal plane 33 (i.e., located at the focus), the line-widths of the line segments 11 of the object 1 are measured at M3 points along a direction of the X axis, then line-widths are measured by shifting a distance along Y axis at M4 point and line-widths are finally measured by shifting a distance along Y axis at M5 point, so as to obtain a third measured value. Furthermore, when the height adjustment member 23 sets the object platform 22 to the forth focal plane 34 (i.e., located at +20 microns of the focus), the line-widths of the line segments 11 of the object 1 are measured at M3 points along a direction of the X axis, then line-widths are measured by shifting a distance along Y axis at M4 point and line-widths are finally measured by shifting a distance along Y axis at M5 point, so as to obtain a fourth measured value. Finally, when the height adjustment member 23 sets the object platform 22 to the fifth focal plane 35 (i.e., located at +40 microns of the focus), the line-widths of the line segments 11 of the object 1 are measured at M3 points along a direction of the X axis, then line-widths are measured by shifting a distance along Y axis at M4 point and line-widths are finally measured by shifting a distance along Y axis at M5 point, so as to obtain a fifth measured value. The measured values (e.g., the first measured value, the second measured value, the third measured value, the fourth measured value, and the fifth measured value) draw line-width curves.

Figure 4:
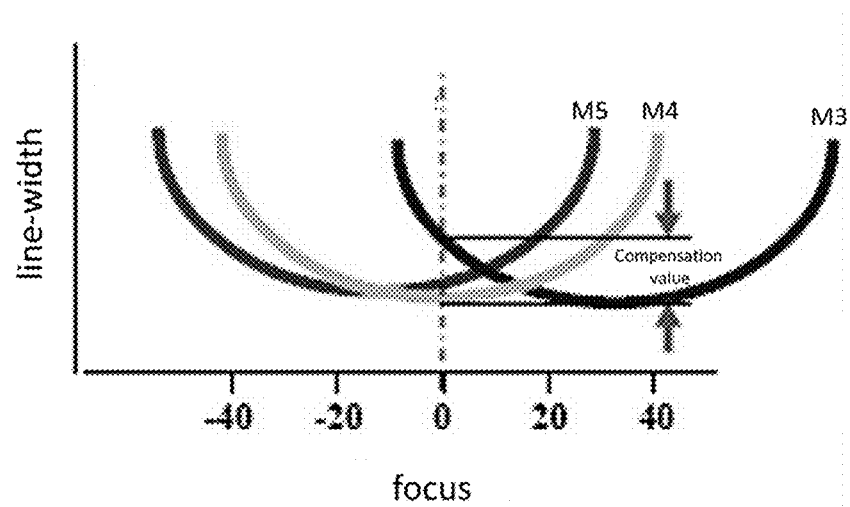
FIG. 4 is a schematic view of a plurality of line-width curves measured by a focusing compensation method according to an embodiment of the present invention.

Referring to FIG. 4, showing a schematic view of line-width curves measured by a focusing compensation method according to an embodiment of the present invention. According to the line-width curves which are drawn by the measured values (e.g., the first measured value, the second measured value, the third measured value, the fourth measured value, and the fifth measured value). The line-width curves may form the measured values into the line-width curves by the processing module 24. A second line-width at a lowest point of the line-width curve subtracts from a first line-width measured at the focus, so as to obtain a compensation value. The compensation value may be processed by the processing module 24 or other processing module to subtract a second line-width at a lowest point of the line-width curve from a first line-width measured at the focus so as to generate and convert to the compensation signal. The exposure lens set 21 further includes lens sets 21 configured to measure the line-widths at the points (for example, M3, M4, and M5) of the line segments 11 along axial directions at a same time, to obtain the line-width curves; and the processing module 24 is configured to obtain the compensation values from the line-width curve, and utilizing the compensation values to calibrate the focusing operation performed by the exposure lens set 21 at the points of line segments along axial directions.

Figure 5A:
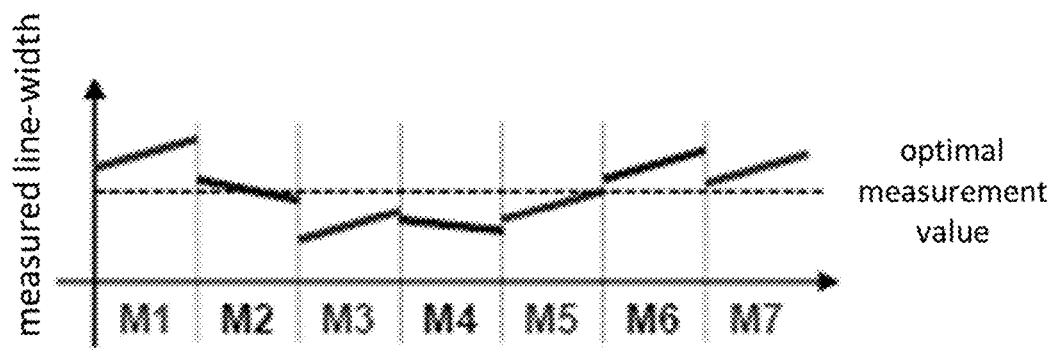
FIG. 5A is a schematic view showing measurements of an exposure lens set before calibration in a focusing compensation method according to the embodiment of the present invention.
Figure 5B:
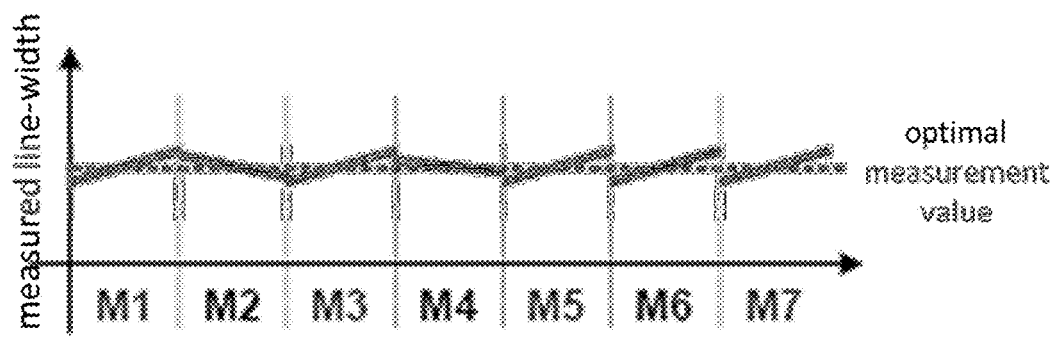
FIG. 5B is a schematic view showing measurements of exposure lens set after calibration in a focusing compensation method according to the embodiment of the present invention.

Please refer to FIG. 5A and FIG. 5B, FIG. 5A is a schematic view showing measurements of an exposure lens set 21 before calibration in a focusing compensation method according to the embodiment of the present invention. FIG. 5B is a schematic view showing measurements of the exposure lens set 21 after calibration in a focusing compensation method according to the embodiment of the present invention. The measured line-width in FIG. 5A is less accurate than the actual line-width, results that the exposure lens set 21 cannot achieve optimal focus. By obtaining at least one of compensation value from the at least one line-width curve, after calibrating the focusing operation of the exposure lens set 21, as shown in FIG. 5B, the measurement values of the line-widths are closer to the optimal measurement value, which greatly improves the focusing accuracy.

As described above, compared with the existing focusing compensation method, although it is possible to improve the focusing stability by measuring multiple points through the exposure machine. However, due to the complicated stacking layers, and the parameters such as self-flatness and deflection, results that the drawbacks such as impossible to provide a high precision focusing and the like.

The focusing compensation method and the apparatus thereof of the present invention calibrates the focusing operation of the exposure lens set by measuring line-widths on an object, which can effectively improve the focusing of the exposure machine, thereby improving the focusing stability.

The elements shown in the figures are not necessarily drawn to scale. That is, in various embodiments, the selected elements are illustrated to enhance the understanding of the function and the setting of the function. In the case of the products implemented in the market, it is generally easy to understand and may be useful or necessary elements, and the schematic views of the following embodiments are not necessarily described. It should also be appreciated that certain actions and/or steps in the embodiments of the method described or depicted are not necessarily required to occur in a particular order, and such specific sequences are not necessarily required by those skilled in the art. In addition, it should be understood that the vocabulary and terms used in the specification have a general meaning, unless there are other specific meanings described in this document, otherwise these words and terms are the meaning of investigation and research in their respective fields.

Although specific embodiments of the invention have been illustrated and described herein, it will be understood by those skilled in the art. It should be appreciated that the described exemplary embodiments or exemplary embodiments are by way of example only, and no limitation Rather, the foregoing summary and detailed description are in the embodiment of the embodiments of the invention. The functions and arrangements of the elements described in the exemplary embodiments may be varied, and in general, the application covers any modifications or variations of the specific embodiments discussed herein.

It is understood that the specific features of the invention are described in the context of separate embodiments, and may be provided in a combination of a single embodiment. Conversely, in the present invention, various features described in the context of a single embodiment may also be separately, or in any suitable sub-combination, or in any other implementation described herein. Provided in the example. The specific features described in the context of the various embodiments are not considered to be essential features of those embodiments unless the embodiment does not function without those elements.

While the invention has been described in terms of the specific embodiments the embodiments. Accordingly, it is intended to embrace in the appended claims.

The invention claimed is:

1. A focusing compensation method, comprising steps of:
    (S11) providing an exposure lens set for a photolithography process, the exposure lens set having a focus;
    (S12) providing an object, measuring a plurality of line-widths of the object at a plurality of points of line segments along an axial direction by a plurality of different focusing conditions, wherein the plurality of different focusing conditions are to dispose the object on a plurality of different focal planes, and measure the line width of the object, to obtain a plurality of measured line-width values, and obtaining at least one line-width curve from the plurality of measured line-width values, wherein the at least one line width curve uses the plurality of different focusing planes as x axis and the plurality of measured line-width values as axis; and
    (S13) obtaining a compensation value from the at least one line-width curve, and utilizing the compensation value to calibrate a focusing operation performed by the exposure lens set at a plurality of points of line segments along a plurality of the axial directions.

2. The focusing compensation method according to claim 1, wherein the plurality of different focusing planes are five focal planes, and the five focal planes are located at −40 microns from the focus, −20 microns from the focus, the focus, +20 microns from the focus, and +40 microns from the focus.

3. The focusing compensation method according to claim 1, wherein the step (S12) further comprises:
    subtracting a second line width at a lowest point of the line-width curve from a first line width measured at the focus, to obtain the compensation value; and
    utilizing the compensation value to calibrate a focus operation performed by the exposure lens set.

4. The focusing compensation method according to claim 1, wherein the step (S13) further comprises:
    measuring the plurality of line-widths of the object at the plurality of points of the line segments along the plurality of axial directions, to obtain a plurality of the line-width curves; and
    obtaining a plurality of the compensation values from the plurality of line-width curves, and utilizing the plurality of compensation values to calibrate the focusing operation performed by the exposure lens set at the plurality of points of the line segments along the plurality of axial directions.

5. A focusing compensation method, comprising steps of:
    (S11) providing an exposure lens set having a focus;
    (S12) providing an object, measuring a plurality of line-widths of the object at a plurality of points of line segments along an axial direction by a plurality of different focusing conditions wherein the plurality of different focusing conditions are to dispose the object on a plurality of different focal planes, and measure the line width of the object, to obtain a plurality of measured line-width values, and obtaining at least one line-width curve from the plurality of measured line-width values, wherein the at least one line width curve uses the plurality of different focusing planes as x axis and the plurality of measured line-width value as Y axis; and (S13) calibrating a focusing operation of the exposure lens set according to the at least one line-width curve.

6. The focusing compensation method according to claim 5, wherein the plurality of different focusing conditions are to dispose the object on five focal planes, and the five focal planes are located at −40 microns from the focus, −20 microns from the focus, the focus, +20 microns from the focus, and +40 microns from the focus.

7. The focusing compensation method according to claim 5, wherein the step (S12) further comprises:
    subtracting a second line width at a lowest point of the line-width curve from a first line width measured at the focus, to obtain a compensation value; and
    calibrating a focusing operation of the exposure lens set according to the compensation value.

8. The focusing compensation method according to claim 5, wherein the step (S12) further comprises:
    measuring the plurality of line-widths of the object at the plurality of points of the line segments along the plurality of axial directions, to obtain a plurality of the line-width curves; and
    obtaining a plurality of compensation values from the plurality of line-width curves, and utilizing the plurality of compensation values to calibrate the focusing operation performed by the exposure lens set at the plurality of points of the line segments along the plurality of axial directions.

9. A focusing compensation apparatus, comprising:
    an exposure lens set having a focus;
    an object platform configured to dispose an object, wherein the exposure lens set is configured to measure a plurality of line-widths of the object at a plurality of points of line segments along an axial direction by a plurality of different focusing conditions, wherein the plurality of different focusing conditions are to dispose the object on a plurality of different focal planes, and measure the line width of the object, to obtain a plurality of measured line-width values;
    a processing module configured to obtain at least one line-width curve from the plurality of measured line-width values, wherein the at least one line width curve uses the plurality of different focusing planes as x axis and the plurality of measured line-width values as Y axis, and obtain a compensation signal according to the at least one line-width curve; and
    a communication module configured to transmit the compensation signal to the exposure lens set, so as to calibrate a focusing operation of the exposure lens set.

10. The focusing compensation apparatus according to claim 9, wherein the object platform comprises a height adjustment member configured to set the object platform at one of different heights, so as to dispose the object on one of the plurality of different focal planes, to measure the line width of the object.

11. The focusing compensation apparatus according to claim 10, wherein the height adjustment member has five different heights corresponding to five focal planes of the exposure lens set, the five focal planes are respectively located at −40 microns from the focus, −20 microns from the focus, the focus, +20 microns from the focus, and +40 microns from the focus.

12. The focusing compensation apparatus according to claim 11, wherein the processing module configured to subtract a second line width at a lowest point of the line-width curve from a first line width measured at the focus, to obtain a compensation value, and convert the compensation value into the compensation signal.

13. The focusing compensation apparatus according to claim 12, wherein the exposure lens set further comprises a plurality of lens groups configured to measure the plurality of line-widths of the object at the plurality of points of the line segments along a plurality of axial directions at a same time, to obtain a plurality of the line-width curves; and
    the processing module is configured to obtain a plurality of compensation value from the plurality of line-width curve, and utilizing the plurality of the compensation values to calibrate the focusing operation performed by the exposure lens set at the plurality of points of the line segments along a plurality of the axial directions.

* * * * *